US010880998B2

(12) United States Patent
Sunshine et al.

(10) Patent No.: US 10,880,998 B2
(45) Date of Patent: *Dec. 29, 2020

(54) CONDUCTIVE STRANDS FOR FABRIC-BASED ITEMS

(71) Applicant: Apple Inc., Cupertino, CA (US)

(72) Inventors: Daniel D. Sunshine, Austin, TX (US); Daniel A. Podhajny, San Jose, CA (US); Kathryn P. Crews, Menlo Park, CA (US); Kirk M. Mayer, San Francisco, CA (US); John Arthur Maasberg, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/993,115

(22) Filed: Aug. 13, 2020

(65) Prior Publication Data

US 2020/0375031 A1    Nov. 26, 2020

Related U.S. Application Data

(63) Continuation of application No. 16/582,485, filed on Sep. 25, 2019, now Pat. No. 10,785,869, which is a (Continued)

(51) Int. Cl.
*C23C 18/16* (2006.01)
*H05K 1/03* (2006.01)
(Continued)

(52) U.S. Cl.
CPC ............. *H05K 1/038* (2013.01); *C23C 18/16* (2013.01); *C23C 18/1633* (2013.01);
(Continued)

(58) Field of Classification Search
CPC .................. H05K 1/038; H05K 3/103; H05K 2201/0281; C23C 18/16; C23C 18/1633;
(Continued)

(56) References Cited

U.S. PATENT DOCUMENTS 4,045,949 A    9/1977  Paton et al.
4,303,733 A    12/1981 Bulle et al.
(Continued)

*Primary Examiner* — Timothy J Thompson
*Assistant Examiner* — Michael F McAllister
(74) *Attorney, Agent, or Firm* — Treyz Law Group, P.C.; G. Victor Treyz; Joseph F. Guihan

(57) ABSTRACT

Strands of material may be intertwined using weaving techniques, knitting techniques, non-woven or entanglement techniques, or braiding techniques. Fabric that is formed from the strands of material may be used in forming a fabric-based item. The fabric based item may include electrical components. The strands may include conductive strands that form signal paths. The signal paths can carry electrical signals associated with operation of the electrical components. Each strand may have an elongated core and a coating. Strands may also include intermediate layers between the cores and coatings. The cores, intermediate layers, and coatings may be formed from polymer without conductive filler, polymer with conductive filler, and/or metal. A polymer core may be provided with recesses to help retain subsequently deposited layers such as a metal coating layer. The recesses may be grooves that extend along the longitudinal axis of the core.

20 Claims, 12 Drawing Sheets

Related U.S. Application Data continuation of application No. 16/280,920, filed on Feb. 20, 2019, now Pat. No. 10,470,305, which is a continuation of application No. 15/942,159, filed on Mar. 30, 2018, now Pat. No. 10,244,625, which is a continuation of application No. 15/146,601, filed on May 4, 2016, now Pat. No. 9,974,170.

(60) Provisional application No. 62/163,802, filed on May 19, 2015.

(51) Int. Cl.
*H01B 13/00* (2006.01)
*C25D 7/06* (2006.01)
*H05K 3/10* (2006.01)

(52) U.S. Cl.
CPC ....... *C25D 7/0607* (2013.01); *H01B 13/0026* (2013.01); *H01B 13/0036* (2013.01); *H05K 3/103* (2013.01); *H05K 2201/0281* (2013.01)

(58) Field of Classification Search
CPC ............ C25D 7/0607; H01B 13/0026; H01B 13/0036
USPC .......................................................... 361/749
See application file for complete search history.

(56) References Cited

U.S. PATENT DOCUMENTS

| | | | | |
|---|---|---|---|---|
| 4,307,376 | A | 12/1981 | Miller et al. | |
| 4,457,973 | A | 7/1984 | Matsui et al. | |
| 4,606,968 | A * | 8/1986 | Thornton | B01D 39/083 442/187 |
| 4,629,925 | A | 12/1986 | Booth et al. | |
| 4,803,096 | A * | 2/1989 | Kuhn | D06M 11/28 252/500 |
| 5,102,727 | A * | 4/1992 | Pittman | D03D 15/00 428/408 |
| 5,486,649 | A | 1/1996 | Gareis | |
| 5,529,829 | A | 6/1996 | Koskenmaki et al. | |
| 5,744,236 | A * | 4/1998 | Rohrbach | D01D 5/24 264/177.12 |
| 5,835,679 | A | 11/1998 | Eckman et al. | |
| 5,840,425 | A | 11/1998 | Hodan | |
| 5,948,528 | A | 9/1999 | Helms et al. | |
| 5,985,450 | A | 11/1999 | Keller | |
| 6,432,850 | B1 * | 8/2002 | Takagi | D02G 3/441 428/373 |
| 6,720,539 | B2 | 4/2004 | DeAngelis et al. | |
| 6,790,796 | B2 * | 9/2004 | Smith | D21F 1/0027 442/189 |
| 6,840,425 | B2 | 1/2005 | Pedigo et al. | |
| 6,844,063 | B2 | 1/2005 | Matsui et al. | |
| 7,094,467 | B2 | 8/2006 | Zhang et al. | |
| 7,348,285 | B2 | 3/2008 | Dhawan et al. | |
| 7,592,276 | B2 * | 9/2009 | Hill | D03D 11/00 442/301 |
| 8,153,282 | B2 * | 4/2012 | Mellott | H01L 31/02168 428/701 |
| 8,393,282 | B2 | 3/2013 | Fujita et al. | |
| 9,315,939 | B2 * | 4/2016 | Luo | D01D 5/253 |
| 2005/0095935 | A1 * | 5/2005 | Levine | D01F 6/96 442/110 |
| 2005/0123750 | A1 | 6/2005 | Hodge et al. | |
| 2006/0125707 | A1 | 6/2006 | Waschenko | |
| 2007/0089800 | A1 * | 4/2007 | Sharma | D03D 15/0027 139/388 |
| 2008/0047733 | A1 | 2/2008 | Axakov et al. | |
| 2008/0202623 | A1 * | 8/2008 | DeAngelis | D06N 3/0063 139/425 R |
| 2008/0272344 | A1 * | 11/2008 | Jiang | H01B 1/22 252/513 |
| 2008/0318483 | A1 | 12/2008 | Salitsky et al. | |
| 2009/0066195 | A1 | 3/2009 | Wang et al. | |
| 2009/0181592 | A1 | 7/2009 | Dugan | |
| 2011/0317240 | A1 | 12/2011 | Sotzing et al. | |
| 2012/0013433 | A1 | 1/2012 | Rauh et al. | |
| 2012/0100386 | A1 | 4/2012 | Honma et al. | |
| 2012/0118427 | A1 | 5/2012 | Brookstein et al. | |
| 2012/0148843 | A1 | 6/2012 | Levine et al. | |
| 2012/0224247 | A1 | 9/2012 | Sotzing et al. | |

* cited by examiner

CONDUCTIVE STRANDS FOR FABRIC-BASED ITEMS

This application is a continuation of patent application Ser. No. 16/582,485, filed Sep. 25, 2019, which is a continuation of patent application Ser. No. 16/280,920, filed Feb. 20, 2019, which is a continuation of patent application Ser. No. 15/942,159, filed Mar. 30, 2018, which is a continuation of patent application Ser. No. 15/146,601, filed May 4, 2016, which claims the benefit of provisional patent application No. 62/163,802, filed May 19, 2015, all of which are hereby incorporated by reference herein in their entireties.

BACKGROUND

This relates generally to strands of material and, more particularly, to conductive strands for forming conductive pathways in fabric-based items.

It may be desirable to form electrical devices, enclosures, and other items from fabric. The fabric may contain insulating and conductive strands. In some situations, it may be desirable to form signal paths or other conductive structures from the conductive strands.

Challenges may arise when forming conductive structures from conductive strands in a fabric. Fabric is often bent back and forth during use. Solid wires may experience large amounts of stress when bent. Polymer strands covered with metal coatings can be used in place of solid wire strands. If care is not taken, however, fabric bending motions may cause a metal coating to be abraded from a polymer strand or may cause a metal coating to fail due to the difference between the modulus of elasticity of the metal coating and the modulus of elasticity of the underlying polymer strand material. Metal coating failures can lead to unexpected open circuits and other reliability issues. Defects such as unexpected open circuits may prevent an item from functioning properly.

It would therefore be desirable to be able to provide improved techniques for forming conductive strands for use in fabric-based items.

SUMMARY

Strands of material may be intertwined using weaving techniques, knitting techniques, non-woven or entanglement techniques, or braiding techniques. Fabric that is formed from the strands of material may be used in forming a fabric-based item. The fabric based item may include electrical components. The strands may include conductive strands that form signal paths. The signal paths can carry electrical signals associated with operation of the electrical components.

Conductive strands may be formed from elongated cores and associated coatings. Strands may also include intermediate layers between the cores and coatings and may include additional layers. The cores, intermediate layers, and coatings may be formed from materials such as polymer without conductive filler, polymer with conductive filler, and metal.

A polymer core may be provided with recesses to help retain subsequently deposited layers such as a metal coating layer. The recesses may be grooves that extend along the longitudinal axis of the core. When a coating is formed on the core, the metal of the coating may extend into the recesses. The recesses may therefore enhance the ability of a core to retain a metal coating. If desired, the bottoms of the recesses may be enlarged to form interlocking features that retain the metal coating.

Extrusion techniques or other fabrication techniques may be used to form elongated polymer cores with longitudinal grooves. Metal coatings may be deposited using electrochemical deposition techniques (e.g., electroless deposition). If desired, additional fabrication techniques may be used in forming layers of material in the conductive strands.

DETAILED DESCRIPTION

Conductive strands of material and insulating strands of material may be used in forming fabric with conductive paths. The conductive paths may be used in forming signal paths (e.g., signal busses, power lines, etc.), may be used in forming part of a capacitive touch sensor electrode, a resistive touch sensor electrode, or other input-output device, or may be used in forming other patterned conductive structures. The conductive structures may be used in carrying power signals, digital signals, analog signals, sensor signals, control signals, data, input signals, output signals, or other suitable electrical signals.

Figure 1:
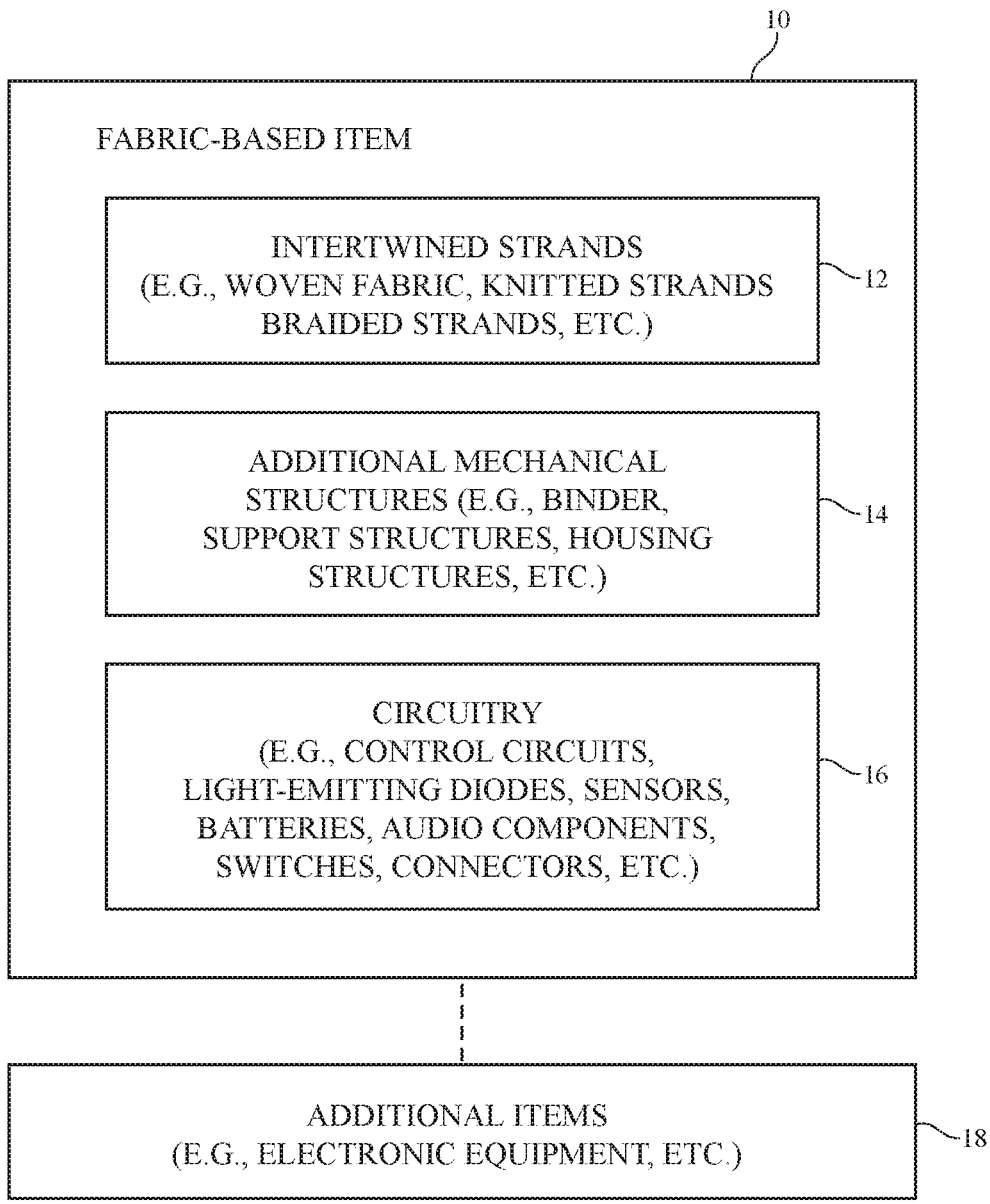
FIG. 1 is a schematic diagram of an illustrative item that may include strands of material in accordance with an embodiment.

The fabric containing these conductive structures may be used in forming a fabric-based item such as illustrative fabric-based item 10 of FIG. 1. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable fabric-based item.

Strands in item 10 may form all or part of a housing wall for an electronic device, may form internal structures in an electronic device, or may form other strand-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

Item 10 may include intertwined strands 12. The strands may be intertwined using strand intertwining equipment such as weaving equipment, knitting equipment, or braiding equipment. Intertwined strands 12 may, for example, form woven fabric, knitted fabric, braided cords, or other items with intertwined strands. Configurations in which item 10 is based on fabric formed from strands 12 are sometimes described herein as an example. This is, however, merely illustrative. Strands 12 may be incorporated into any suitable items.

Strands 12 may be single-filament strands (sometimes referred to as fibers) or may be threads, yarns, ply yarns, cords, ropes, or other strands that have been formed by intertwining multiple filaments of material together. Strands may be formed from polymer, metal, glass, graphite, ceramic, natural strands such as cotton or bamboo, or other organic and/or inorganic materials and combinations of these materials. Conductive coatings such as metal coatings may be formed on non-conductive strands (e.g., plastic cores) to make them conductive. Reflective coatings such as metal coatings may be applied to strands to make them reflective. Strands 12 may also be formed from single-filament metal wire (e.g., bare metal wire), multifilament wire, or combinations of different materials. Strands may be insulating or conductive. Conductive strands may have exposed conductive surfaces or may be insulated.

Strands 12 may be conductive along their entire length or may have conductive segments. Strands 12 may have metal portions or other conductive portions that are selectively exposed by locally removing insulation (e.g., to form connections with other conductive strand portions). Strands 12 may also be formed by selectively adding a conductive layer to a portion of a non-conductive strand.). Threads and other multifilament yarns that have been formed from intertwined filaments may contain mixtures of conductive strands and insulating strands (e.g., metal strands or metal coated strands with or without exterior insulating layers may be used in combination with solid plastic strands or natural strands that are insulating).

Conductive strands (complete conductive strands and/or conductive strand segments) that cross other conductive strands may be shorted to each other to form a portion of a signal path. Electrical connections of this type may be formed by virtue contacting a first conductive strand with a second conductive strand.

Item 10 may include additional mechanical structures 14 such as polymer binder to hold strands 12 together, support structures such as frame members, housing structures (e.g., an electronic device housing), and other mechanical structures.

To enhance mechanical robustness and electrical conductivity at strand-to-strand connections, additional structures and materials (e.g., solder, crimped metal connections, welds, conductive adhesive, non-conductive adhesive, fasteners, etc.) may be used to help form strand-to-strand connections at strand intersections where connections are desired. Insulating material can be interposed between intersecting conductive strands at locations in which it is not desired to form a strand-to-strand connection. The insulating material may be plastic or other dielectric, may include an insulating strand or a conductive strand with an insulating coating, and may provide continuous or discontinuous coverage.

Circuitry 16 may be included in item 10. Circuitry 16 may include components that are coupled to strands 12, components that are housed within an enclosure formed by strands 12, components that are attached to strands 12 using welds, solder joints, adhesive bonds (e.g., conductive adhesive bonds), crimped connections, or other electrical and/or mechanical bonds. Circuitry 16 may include metal structures for carrying current, integrated circuits, discrete electrical components such as resistors, capacitors, and inductors, switches, connectors, light-emitting components such as light-emitting diodes, audio components such as microphones and speakers, vibrators, solenoids, piezoelectric devices, and other electromechanical devices, connectors, microelectromechanical systems (MEMs) devices, pressure sensors, light detectors, proximity sensors, force sensors, moisture sensors, temperature sensors, accelerometers, gyroscopes, compasses, magnetic sensors, touch sensors, and other sensors, components that form displays, touch sensors arrays (e.g., arrays of capacitive touch sensor electrodes to form a touch sensor that detects touch events in two dimensions), and other input-output devices. Circuitry 16 may also include control circuitry such as non-volatile and volatile memory, microprocessors, application-specific integrated circuits, system-on-chip devices, baseband processors, wired and wireless communications circuitry, and other integrated circuits.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a case or other structure that receives the electronic device in a pocket, an interior cavity, or other portion of item 10. In other situations, item 18 may be a wrist-watch device or other electronic device and item 10 may be a strap or other fabric-based item that is attached to item 18. In still other situations, item 10 may be an electronic device, strands 12 may be used in forming the electronic device, and additional items 18 may include accessories or other devices that interact with item 10. Signal paths formed from conductive strands may be used to route signals in item 10 and/or item(s) 18.

Figure 2:
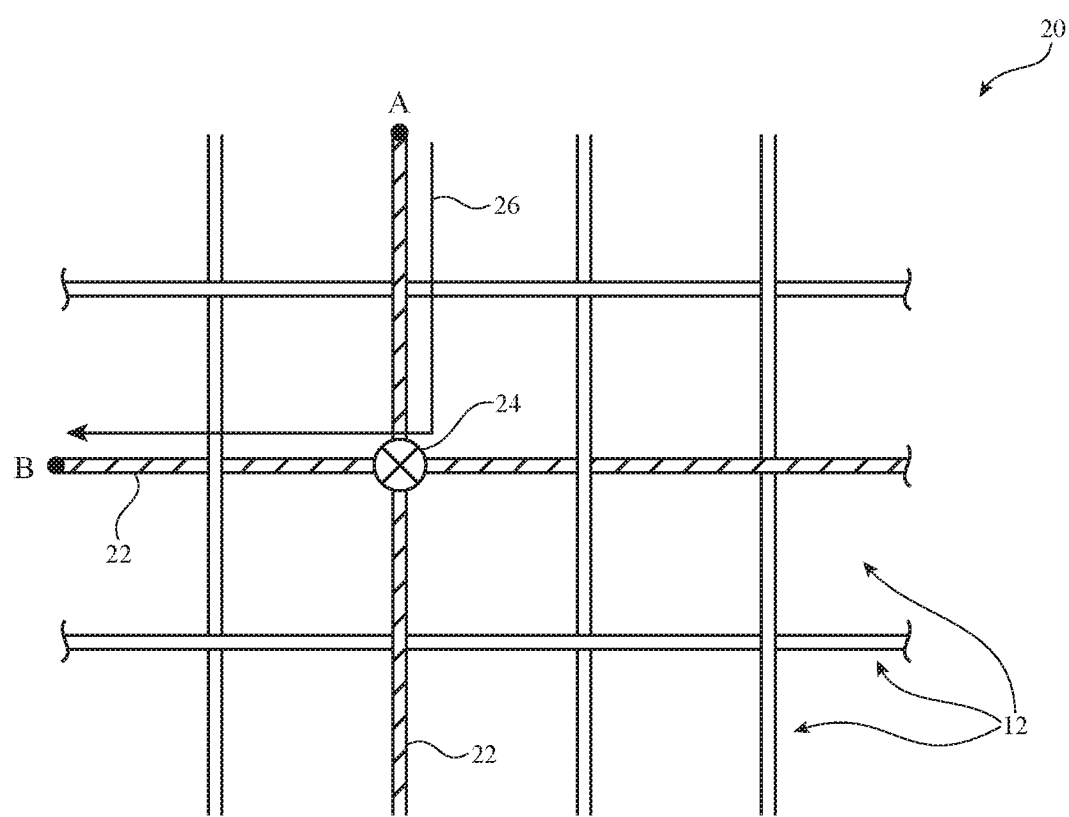
FIG. 2 is a diagram of a portion of a fabric with conductive strands in accordance with an embodiment.

The strands that make up item 10 may be intertwined to form a fabric such as illustrative fabric 20 of FIG. 2. Fabric 20 may include strands 12. Strands 12 may be formed from conductive and/or insulating materials. As an example, fabric may be formed from insulating strands interspersed with conductive strands 22. In the illustrative configuration of FIG. 2, a first conductive strand 22 extends vertically and electrically connects node A and junction 24 and a second conductive strand 22 extends horizontally (i.e., perpendicular to the first conductive strand) and electrically connects node B and junction 24. At the intersection of the first and second conductive strands at junction 24, the first and second strands may be electrically connected using mechanical contact, solder, welds, conductive adhesive, a crimped metal connection or other metal connector, or other electrical connection structure. Using this type of technique, desired signal paths such as illustrative signal path 26 between nodes A and B may be formed within fabric 20 (e.g., to form signal busses, to form parts of sensors, to form other conductive structures, etc.).

Conductive strand 22 may be formed from one or more layered materials. For example, conductive strand 22 may have a core (e.g., an elongated member such as a monofilament) and an outer coating or conductive strand 22 may have a core, an intermediate layer, and an outer coating. The different portions of the conductive strand may be formed from different materials or, if desired, two or more of the portions of the conductive strand may be formed from the same material. As an example, a conductive strand may have a core and a coating that are formed from a common metal and that are separated by an intermediate layer formed from a different material.

In some configurations, conductive strand 22 may contain polymer. For example, conductive strand 22 may contain a polymer core to provide strand 22 with strength and flexibility. Examples of polymers that may be used in forming core 28 or other layers in strand 22 include polyamide (nylon—e.g., nylon6, nylon6,6, nylon 11), aromatic polyamide (i.e., para-aramids Kevlar® or other aramids), polyimide, polyester, polyolefin, acrylic, polyethylene, extruded cellulosic polymers such as rayon and Tencel® and polyurethane. Other polymers or mixtures of these polymers may be used, if desired. Core components may also be formed from non-polymer strands such as strands of cotton, wool, and other staple length yarns.

The polymer materials of strand 22 may be formed from conductive organic material, from insulating polymeric materials, from polymer that includes conductive filler such as particles of metal, particles of carbon nanotube material, graphene particles, fibrous carbon material, or other conductive particles. Conductive filler may be incorporated into the polymer in a concentration that renders a portion of strand 22 conductive or may be incorporated into the polymer in a lower concentration (e.g., to promote adhesion or otherwise enhance compatibility with other portions of strand 22 without necessarily increasing the conductivity of the polymer to a level that allows the material to serve as a conductive signal path in fabric 20).

In some situations, monofilaments may be formed of metal or polymer (i.e., polymer with conductive filler or without conductive filter). These monofilaments may be intertwined to form strands 22 or portions of strands 22. In general, strands 22 may have one or more materials, two or more materials, three or more materials, four or more materials, or five or more materials. The structures of strands 22 may incorporate conductive materials such as metal, insulating materials such as polymer, conductive organic materials such as conductive polymer, polymer filled with metal particles and other conductive filler, other materials, and/or combinations of these materials.

Figure 3:
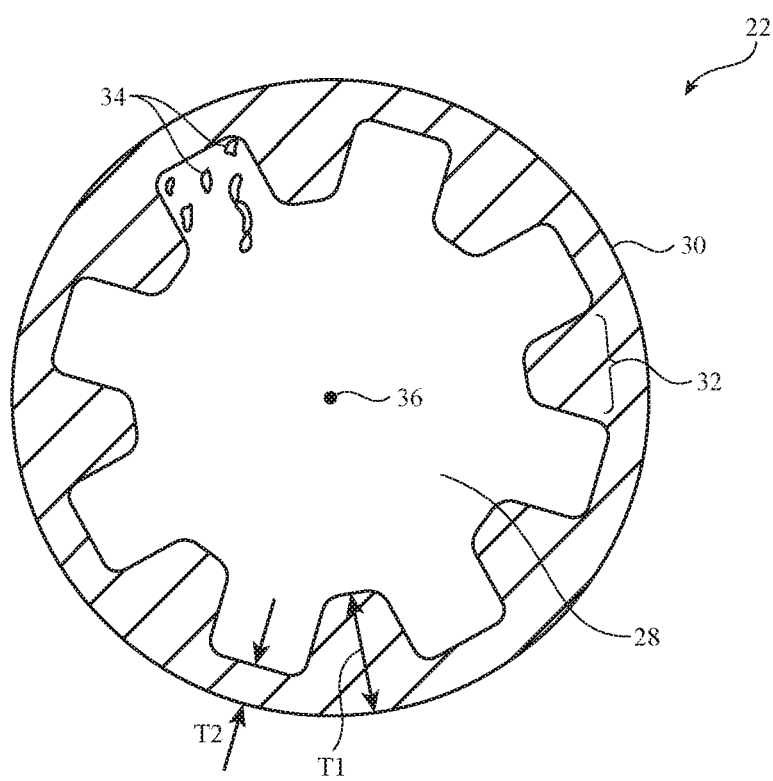
FIG. 3 is a cross-sectional side view of an illustrative conductive strand in accordance with an embodiment.

To enhance the robustness of conductive strands, the core of strands 22 and/or other layers in strands 22 may be provided with textured surfaces. For example, strands 22 may have polymer cores with recesses such as longitudinal grooves that help adhere metal coatings onto strands 22. A configuration of this type is shown in the cross-sectional side view of illustrative strand 22 of FIG. 3. As shown in FIG. 3, strand 22 may have a core such as core 28 and a coating such as coating 30. Core 28 may be formed from polymer. Conductive filler such as conductive particles 34 may be incorporated into polymer core 28 or conductive particles 34 may be omitted. The incorporation of filler particles 34 into core 28 may enhance the strength of core 28, may promote adhesion with adjacent layers, and may, at higher concentrations, render core 28 conductive.

Core 28 may be coated with a coating layer such as coating 30. Coating 30 may be a conductive material such as metal. Examples of metals that may be used in forming coating 30 include gold, silver, copper, aluminum, nickel, palladium, molybdenum, platinum, titanium, and tungsten. Other metals may also be used in forming coating 30. Coating 30 may be formed from an elemental metal or the metal that forms coating 30 may be part of a metal alloy.

When fabric 20 is bent during use of item 10, stresses can arise in strands 22 and the surface of strands 22 may rub against other strands. To help retain coating 30 on strand 22, core 28 may be provided with recesses such as recesses 32. Strand 22 may have a circular cross-sectional outline (as shown in FIG. 3) or other cross-sectional outline and may have an elongated shape with a longitudinal axis such as axis 36 that extends into and out of the page of FIG. 3. The diameter of strand 22 may be 1-100 microns, more than 20 microns, less than 50 microns, less than 500 microns, or other suitable size. Recesses 32 may be pits in the outer surface of core 28 or may be elongated recesses such as grooves that run along the surface of core 28 parallel to the longitudinal axis (or that spiral around core 28 while running along the length of core 28). Other textured surfaces may be used, if desired. The use of groove-shaped recesses such as recesses 32 is merely illustrative.

Due to the presence of recesses 32, coating 30 may have different thicknesses in different areas. In portions of coating 30 that do not overlap recesses 32, coating 30 may overlap a protruding portion of core 28 and may have a relatively small thickness such as thickness T2. In portions of coating 30 that overlap recesses 32, coating 30 may have a larger thickness such as thickness T1 (T1>T2). The values of T1 and T2 may be less than 50 microns, less than 20 microns, 1-100 microns, more than 1 micron, or other suitable thicknesses. The depth of recesses 32 may be 1-100 microns, less than 20 microns, less than 4 microns, more than 5 microns, or other suitable depth. Recesses 32 enhance the surface area of core 28 and therefore help adhere coating 30 to core 28. The presence of recesses 32 may also help shield some of layer 30 from direct contact from external objects (e.g., when strands are being rubbed against each other). As a result, strand 22 may retain conductive coating 30 even in environments in which strand 22 is exposed to wear.

Moreover, it has been observed that conductive coatings on fibers with cylindrical cross sections can fracture when exposed to excessive bending stresses. These bending stresses increase for locations at increasing distances from the neutral bending axis (distance from the center-of-mass of the fiber cross-section). By placing at least some of the conductive material of coating 30 in concave areas on the cross-section such as recesses 32, bending stresses in the conductive material can be significantly reduced, thereby reducing or eliminating bend-induced fractures to coating 30.

If desired, strands 22 may be based on polymer yarns containing multiple filaments. The yarn denier (gram weight of 9000 meters of yarn) for yarn strands may be between 15 and 250 denier or other suitable denier. Yarn elongation may be less than 20% (or other suitable value) during use to minimize failure of metal coating 30 (e.g., plated metal) due to strain elongation of the polymer filaments. Yarn tenacity may be between 6 and 9 denier per filament. To help prevent broken and loose filaments from breaking off of the yarn, the yarn may be provided with between 30-100 twists per meter or other suitable amount of twisting.

Figure 4:
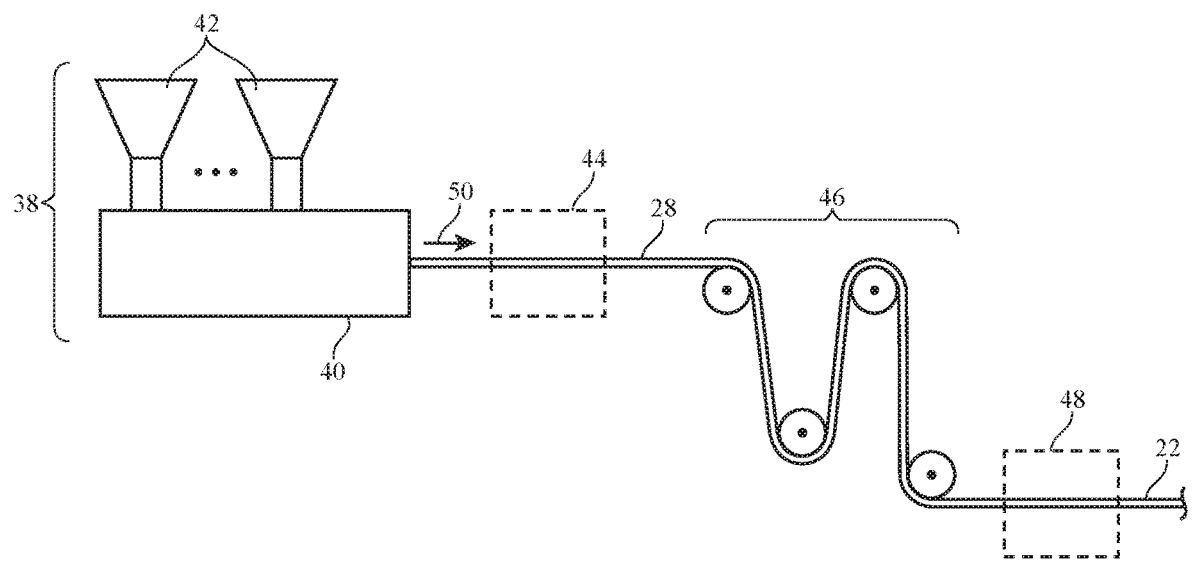
FIG. 4 is a diagram of illustrative extrusion and coating equipment of the type that may be used in forming conductive strands in accordance with an embodiment.

FIG. 4 is a diagram showing illustrative equipment that may be used in forming strand 22. As shown in FIG. 4, core 28 of strand 22 may be extruded from polymer extruding tool 38 in direction 50. Tool 38 may have one or more hoppers such as hoppers 42 that are filled with plastic pellets or other sources of polymer. Tool 38 may heat the plastic pellets until the polymer for core 28 has been melted. The molten polymer (e.g., molten thermoplastic) for core 28 may then be extruded through extrusion head 40. If desired, grooves or other recesses such as recesses 32 may be formed by simultaneously extruding first and second plastic portions through a shared opening in head 40. With this type of approach, the first plastic portion may have the shape of core 28 and the second plastic portion may fill recesses 32. The second portion (which may, if desired, be formed from materials other than plastic) may be removed in chemical bath 44 (e.g., a liquid solvent bath or other chemical treatment) after extrusion to expose core 28.

Pulley system 46 may, if desired, be used to stretch core 28 and thereby reduce the diameter of core 28. Coating tool 48 may be used to apply coating 30 to core 28 and thereby form strand 22. Tool 48 may, as an example, apply a metal coating to core 28 using electrochemical deposition (e.g., electroless plating or electroplating using an applied current). Coating 30 may also be deposited by physical vapor deposition, chemical vapor deposition, dipping and curing (e.g., when coating core 28 with a conductive liquid layer coating layer such as a conductive polymer or a polymer with a conductive filler), application from a brush, needle, liquid-infused pad, or other dispenser, or other coating technique.

Figure 5:
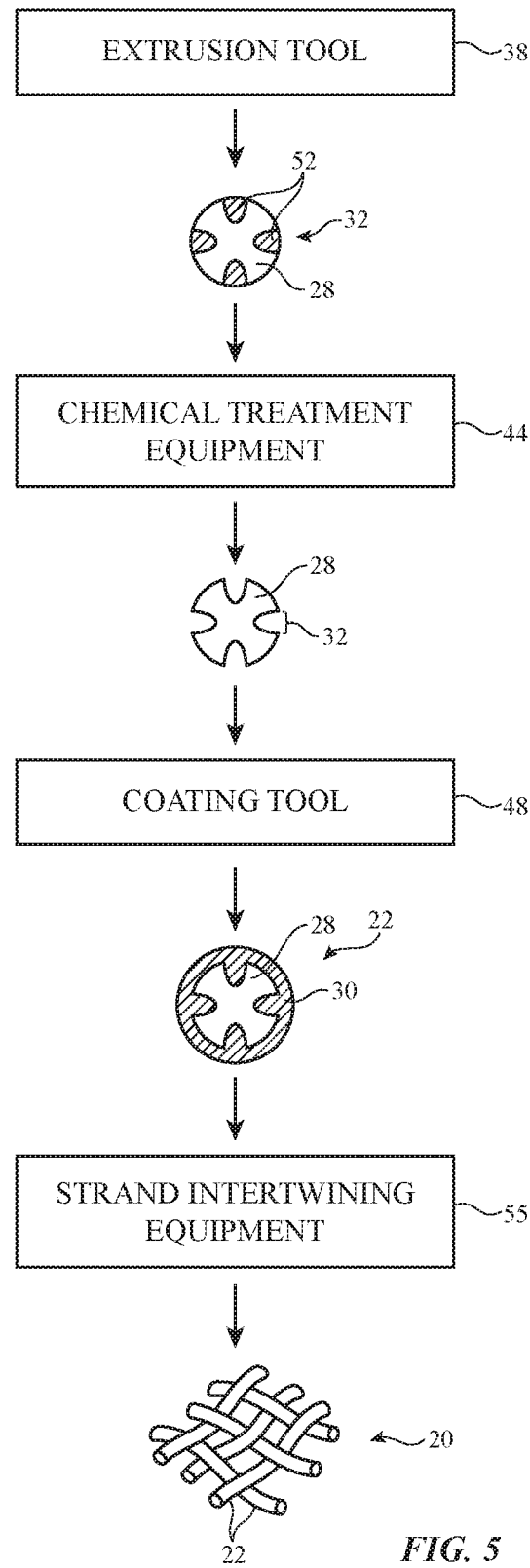
FIG. 5 is a diagram showing equipment and operations involved in forming fabric-based items with conductive strands in accordance with an embodiment.

FIG. 5 is a diagram of illustrative operations and equipment involved in forming strands such as strand 22. Initially, extrusion tool 38 may extrude core 28 with removable material 52 filling recesses 32. Removable material 52 may be a polymer or other material that can be removed by chemical treatment in chemical treatment equipment 44 to produce core 28 with unfilled recesses 32. Coating tool 48 may then be used to form coating 30 on the exterior of core 28. Coating 30 may, for example, be a metal coating that is deposited on core 28 using electroless deposition. Core 28 may include metal filler particles or other conductive filler 34 to promote metal deposition and adhesion. After strands 22 have been formed in this way, strand intertwining equipment (e.g., weaving equipment, knitting equipment, or braiding equipment) may be used to form an item with intertwined strands 22 such as fabric 20. Item 10 may be assembled using fabric 20 and other component.

Figure 6:
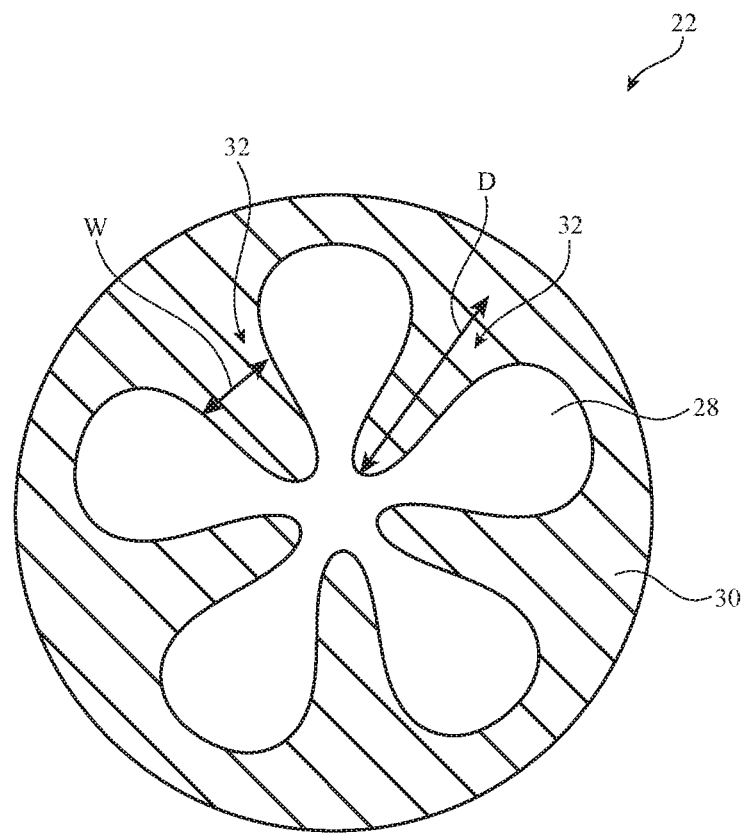
FIG. 6 is a cross-sectional side view of an illustrative conductive strand with a series of deep longitudinal grooves that are spaced evenly about the circumference of the strand and that are covered with a coating in accordance with an embodiment.

If desired, recesses 32 may be provided with relatively deep groove shapes to help enhance the ability of recesses 32 to retain coating 30. This type of arrangement is shown in FIG. 6. In the example of FIG. 6, depth D of each recess 32 is greater than width W. Width W may be, for example, the full-width-half-maximum width of recess 32. In general, D may be 0.1-10 times W, 0.1-1 times W, 1-10 times W, 2-4 times W, etc. The example of FIG. 6 in which D is greater than W is merely an example.

Figure 7:
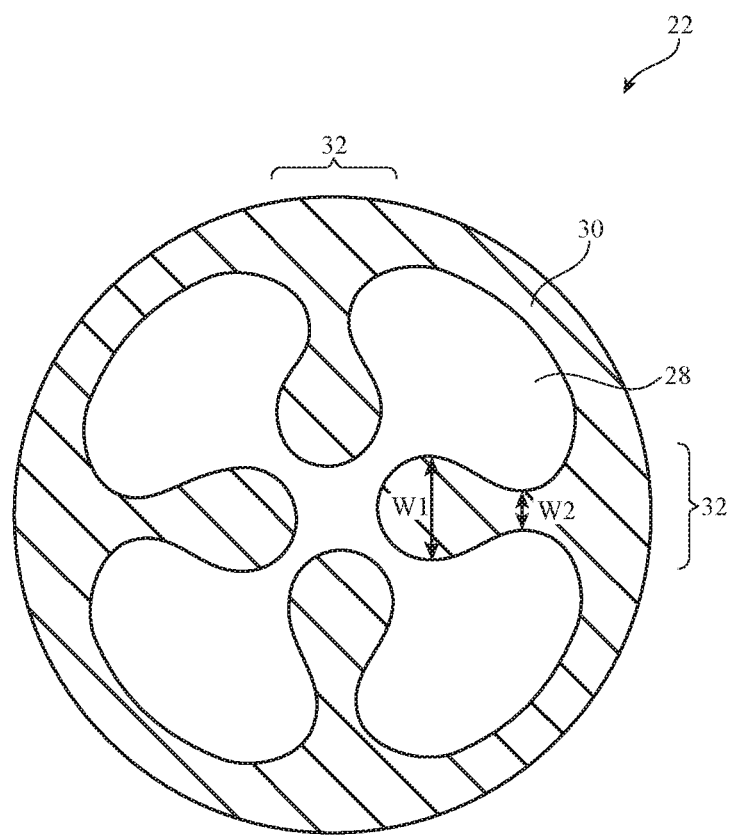
FIG. 7 is a cross-sectional side view of an illustrative conductive strand having an elongated core with grooves that are widened near the center of the core to form interlocking features to retain a coating in accordance with an embodiment.

In the illustrative configuration of FIG. 7, each recess 32 has an interlocking portion with a locally expanded width W1. Because width W1 at the bottom of recess 32 of FIG. 7 is greater than width W2 in the middle of recess 32, metal or other coating 30 that has been deposited within recess 32 will be secured into place. Coating retention features such as interlocking recess shapes of the type shown in FIG. 7 in which recess 32 widens near the center of strand 22 may be used to help retain coating 30 when strand 22 is subjected to wear in fabric 20.

Figure 8:
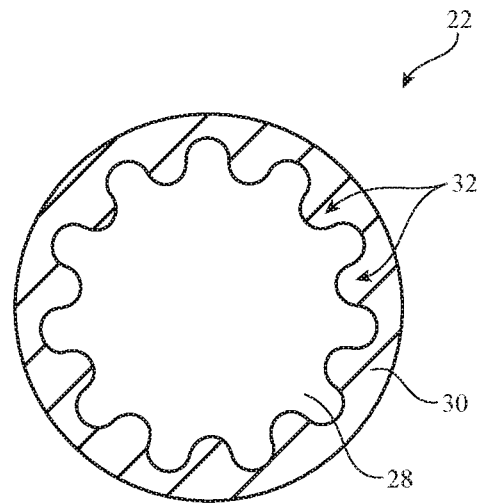
FIG. 8 is a cross-sectional side view of an illustrative conductive strand having shallow longitudinal grooves that are spaced evenly about the circumference of the strand and that are covered with a coating in accordance with an embodiment.

As shown in FIG. 8, recesses 32 may be relatively shallow (e.g., D may be 0.1-1 times W). Shallow grooves or other shallow recesses 32 may help enhance the exposed surface area of core 28 and thereby enhance adhesion between coating 30 and core 28. Recesses 32 may be spread evenly about the circumference of strand 22 as shown in FIG. 8 or may be distributed in other patterns.

Figure 9:
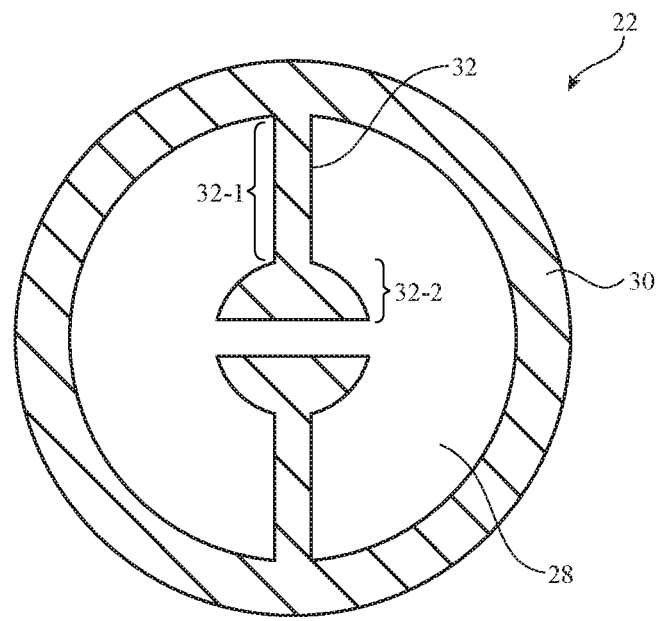
FIG. 9 is a cross-sectional side view of an illustrative conductive strand having a pair of opposing grooves with profiles that form interlocking features to retain a coating in accordance with an embodiment.

The illustrative arrangement of FIG. 9 shows how each recess 32 may be provided with a portion that has straight sidewalls such as portion 32-1 and a flared interlocking portion such as portion 32-2 that has selectively widened sidewalls to lock coating 30 in place. There are a pair of recesses 32 on opposing sides of strand 22 in the configuration of FIG. 9 which may help balance the compressive and tensile strains that are imparted to coating 30 in recesses 32 when strand 22 is bent. More than two recesses of the type shown in FIG. 9 or a single recess may be used if desired.

Figure 10:
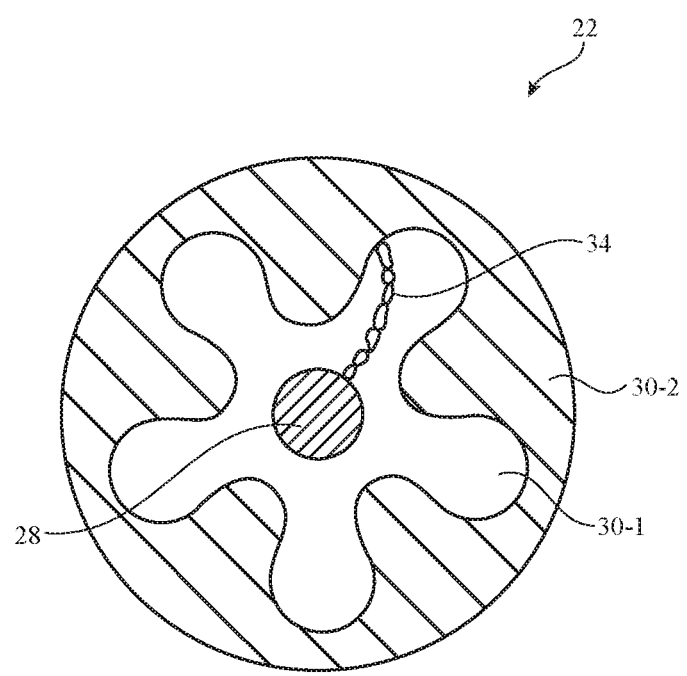
FIG. 10 is a cross-sectional side view of an illustrative conductive strand having a conductive core, a polymer intermediate layer with conductive filler, and an outer conductive layer that is electrically shorted to the conductive core through the intermediate layer in accordance with an embodiment.

In some arrangements, it may be desirable to form conductive strands 22 from three or more layers. In the example of FIG. 10, core 28 is covered with recessed intermediate layer 30-1 and outer coating 30-2. Core 28 may be a conductive material such as metal. Intermediate layer 30-1 may be a polymer that has a conductive filler such as illustrative filler particles 34. Particles 34 may be provided with a sufficient density to form conductive paths between metal core 28 and outer coating layer 30-2.

Outer coating layer 30-2 may be a metal coating or other conductive layer. Because coating layer 30-2 is shorted to metal core 28 through layer 30-1, the conductivity of strand 22 of FIG. 10 may be minimized. If desired, core 28 may be formed from a first polymer and intermediate layer 30-1 may be formed from a second polymer (each of which may optionally include conductive filler 34). The use of a conductive metal core, conductive intermediate polymer layer, and conductive metal outer layer is merely illustrative.

Figure 11:
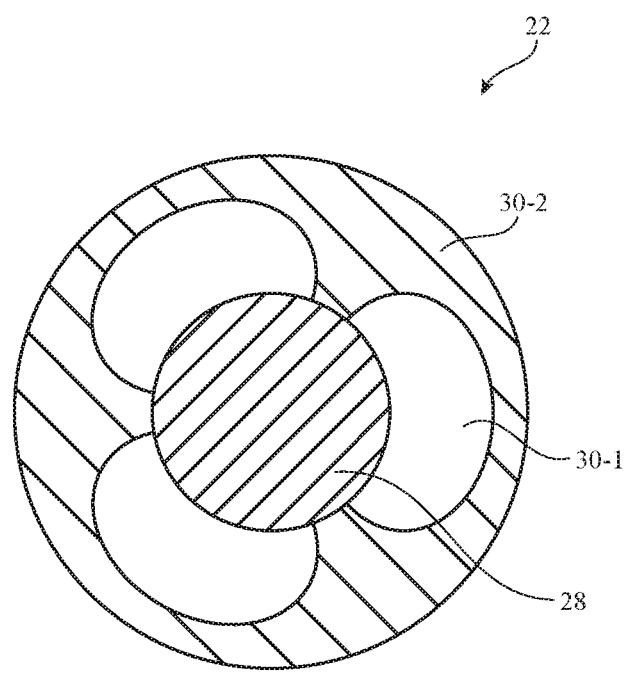
FIG. 11 is a cross-sectional side view of an illustrative conductive strand having a conductive core, a polymer intermediate layer with grooves that penetrate to the core, and a conductive coating that extends into the grooves to contact the conductive core in accordance with an embodiment.

In the example of FIG. 11, outer coating layer 30-2 is able to penetrate to core 28 using recesses 32 (openings) that pass entirely through intermediate layer 30-1. Outer layer 30-2 may be a metal layer and core 28 may be formed from metal. Intermediate layer 30-1 may be a polymer layer and may or may not include conductive filler 34. With this type of configuration, it is not necessary for conductive filler 34 to be incorporated into intermediate layer 30-1 in order for outer layer 30-2 to be electrically connected to metal core 28, because electrical connections are formed between layer 30-2 and core 28 through the openings in intermediate layer 30-1.

Figure 12:
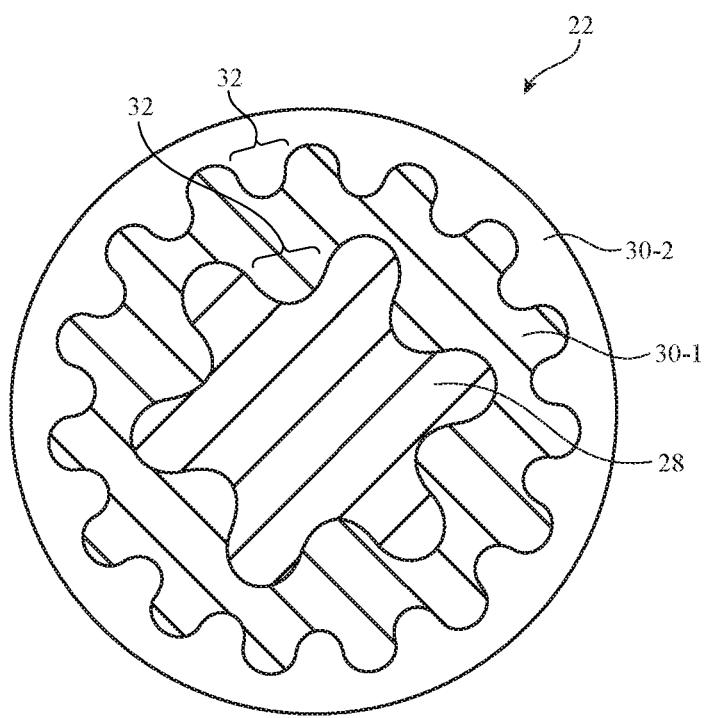
FIG. 12 is a cross-sectional side view of an illustrative conductive strand with a grooved core, a grooved intermediate layer, and a coating layer in accordance with an embodiment.

FIG. 12 shows how conductive strand 22 may have core and intermediate layers with recesses 32 (e.g., deep recesses, shallow recesses of the type shown in FIG. 12, longitudinal recesses such as grooves, recesses with other shapes, recesses with a combination of different shapes and sizes, etc.). If desired, recesses 32 may be omitted from core 28 and/or intermediate layer 30-1. Core 28, intermediate layer 30-1, and outer coating layer 30-2 may be formed from polymer without conductive filler, metal, polymer filled with conductive filler, and/or other suitable materials.

With one suitable arrangement, core 28 of FIG. 12 is formed from a polymer to provide strand 22 with strength and flexibility and intermediate layer 30-1 is a polymer layer that includes conductive filler 34 to enhance the conductivity of strand 22 and to enhance adhesion to outer layer 30-2. Outer layer 30-2 may be metal coating to enhance the conductivity of strand 22 and to facilitate electrical connections with other conductive fibers, electrical components, etc. If desired, outer layer 30-2 may be formed from a polymer that has a large amount of conductive filler 34 so that the conductivity of layer 30-2 is sufficiently large to serve as signal path in fabric 20 while exhibiting satisfactory flexibility and abrasion resistance.

Figure 13:
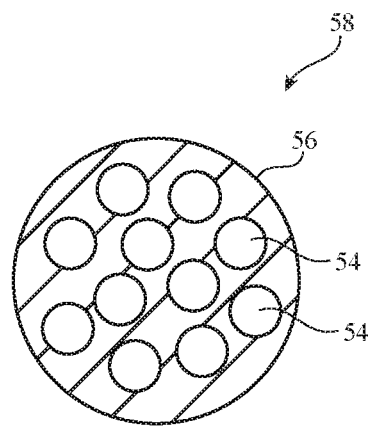
FIG. 13 is a cross-sectional side view of a bundle of strands covered with a coating in accordance with an embodiment.

Conductive strands and/or insulating strands may, if desired, by intertwined to form multi-filament strands. This type of arrangement is shown in FIG. 13. In the example of FIG. 13, multifilament strand 58 has been formed by intertwining multiple strands 54. Strands 54 may be insulating strands, conductive strands, and/or strands such as the multilayer conductive strands described in connection with strands 22. An optional coating such as coating 56 may cover strands 54. Coating 56 may be polymer (with or without conductive filler 34), may be metal, or may be other suitable material.

Figure 14:
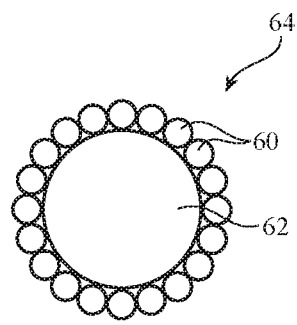
FIG. 14 is a cross-sectional side view of an illustrative conductive strand arrangement in which strands are wrapped around a core in accordance with an embodiment.

FIG. 14 shows and arrangement in which core strand 62 has been wrapped with outer strands 60 to form multifilament strand 64. Strand 62 may be, for example, a polymer core (with or without conductive filler) or may be a core such as conductive core 22. Wrapping strands 60 may be conductive strands 22 and/or may include other conducting and/or insulating strands.

Figure 15:
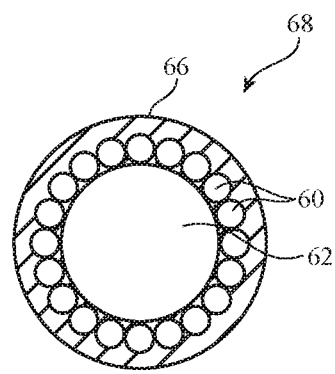
FIG. 15 is a cross-sectional side view of the wrapped core of FIG. 14 following application of a coating layer in accordance with an embodiment.

As shown in FIG. 15, strands 62 and 60 may be covered with coating 66 to form multifilament strand 68. Coating 66 may be an insulating polymer, a conducting polymer, a polymer layer that is conductive due to the incorporation of conductive filler 34, and/or a metal layer. Strand 68 may be formed by wrapping strands 60 around strand 62 and depositing layer 66 by dipping, electrochemical deposition, or other deposition techniques or may be formed by wrapping a strip of material such as layer 66 that includes embedded strands 60 around core 62 (using longitudinal wrapping and/or spiral wrapping techniques).

The foregoing is merely illustrative and various modifications can be made by those skilled in the art without departing from the scope and spirit of the described embodiments. The foregoing embodiments may be implemented individually or in any combination.

What is claimed is:

1. A conductive strand for carrying signals within a fabric, comprising:
    an elongated polymer core with recesses;
    a conductive layer on the elongated polymer core, wherein the conductive layer has first portions in the recesses and second portions that are interposed between the recesses and that are electrically connected to the first portions; and
    an exterior insulating layer on the conductive layer.

2. The conductive strand defined in claim 1, wherein the first portions of the conductive layer have a first thickness and the second portions of the conductive layer have a second thickness that is less than the first thickness.

3. The conductive strand defined in claim 1, wherein the conductive layer comprises metal.

4. The conductive strand defined in claim 1, wherein the recesses comprise grooves.

5. The conductive strand defined in claim 4, wherein the elongated polymer core is elongated along a longitudinal axis and wherein the grooves run parallel to the longitudinal axis.

6. The conductive strand defined in claim 1, wherein the recesses comprise a plurality of pits in an outer surface of the elongated polymer core.

7. The conductive strand defined in claim 1, wherein each recess has a width and a depth that is between 0.1 and 1 times the width.

8. A conductive strand for carrying signals within a fabric, comprising:
    an elongated conductive core;
    an intermediate layer that covers the elongated conductive core, wherein the intermediate layer comprises a polymer layer with conductive filler; and
    a conductive coating on the intermediate layer, wherein the conductive filler electrically connects the conductive coating to the conductive core.

9. The conductive strand defined in claim 8, wherein the conductive core is formed from metal.

10. The conductive strand defined in claim 8, wherein the conductive coating is a metal coating.

11. The conductive strand defined in claim 8, wherein the conductive filler comprises metal particles.

12. The conductive strand defined in claim 8, wherein the conductive filler comprises carbon nanotube material.

13. The conductive strand defined in claim 8, wherein the conductive filler comprises graphene particles.

14. The conductive strand defined in claim 8, wherein the conductive filler comprises fibrous carbon material.

15. The conductive strand defined in claim 8, wherein the intermediate layer has a plurality of recesses and wherein the conductive coating is formed in the recesses.

16. The conductive strand defined in claim 15, wherein the conductive coating has first portions in the recesses and second portions that are interposed between the recesses, wherein the first portions of the conductive coating have a first thickness, and wherein the second portions of the conductive coating have a second thickness that is less than the first thickness.

17. A multi-filament strand for carrying signals within a fabric, the multi-filament strand comprising:
   a core strand;
   a plurality of strands wrapped around the core strand; and
   a coating formed over the plurality of strands.

18. The multi-filament strand defined in claim 17, wherein the coating is a conductive coating.

19. The multi-filament strand defined in claim 17, wherein the plurality of strands comprises a plurality of conductive strands.

20. The multi-filament strand defined in claim 17, wherein the core strand is a polymer core strand.

\* \* \* \* \*